United States Patent
Ahn et al.

(10) Patent No.: US 7,351,653 B2
(45) Date of Patent: Apr. 1, 2008

(54) METHOD FOR DAMASCENE PROCESS

(75) Inventors: Jeong-Hoon Ahn, Yongin-si (KR);
Kyung-Tae Lee, Seoul (KR);
Yoon-Hae Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 37 days.

(21) Appl. No.: 11/498,888

(22) Filed: Aug. 3, 2006

(65) Prior Publication Data
US 2007/0037383 A1   Feb. 15, 2007

(30) Foreign Application Priority Data
Aug. 11, 2005   (KR) .................. 10-2005-0073882

(51) Int. Cl.
*H01L 21/4763* (2006.01)
(52) U.S. Cl. .............. 438/637; 438/624; 438/778; 438/692; 257/E23.011
(58) Field of Classification Search .......... 438/624, 438/637, 778, 692; 257/E23.011
See application file for complete search history.

(56) References Cited

U.S. PATENT DOCUMENTS 6,503,827 B1 * 1/2003 Bombardier et al. ........ 438/631
6,624,063 B2 * 9/2003 Hasegawa et al. .......... 438/623

FOREIGN PATENT DOCUMENTS

| JP | 2002-134505 | 5/2002 |
| KR | 10-2002-0078368 | 10/2002 |
| KR | 10-2004-0107135 | 12/2004 |

* cited by examiner

*Primary Examiner*—David A Zarneke
*Assistant Examiner*—Jenny L. Wagner
(74) *Attorney, Agent, or Firm*—Mills & Onello LLP

(57) ABSTRACT

Disclosed are methods for carrying out a damascene process in semiconductor fabrication including the steps of: forming an intermetal dielectric film on a semiconductor substrate; patterning the intermetal dielectric film and forming an intermetal dielectric pattern comprising at least two layers of different chemical compositions that includes at least an opening penetrating the intermetal dielectric film; forming a conductive film to fill the opening on the intermetal dielectric pattern; and etching the conductive film by means of a chemical/mechanical polishing operation until exposing an upper face of the intermetal dielectric pattern and the top of the filled opening so as to form a conductive pattern. An etching process is then performed to selectively remove an upper portion of the intermetal dielectric pattern. Because the intermetal dielectric film is variable in chemical composition according to different constituent layers, the upper portion of the intermetal dielectric pattern can be selectively removed by using a chemical etching composition that demonstrates etching selectivity relative to the different layers of the intermetal dielectric film.

16 Claims, 7 Drawing Sheets

METHOD FOR DAMASCENE PROCESS

CROSS-REFERENCE TO RELATED APPLICATIONS

This U.S. non-provisional patent application claims priority under 35 U.S.C. § 119 of Korean Patent Application 2005-73882 filed on Aug. 11, 2005, the entire contents of which are hereby incorporated by reference.

BACKGROUND

The subject matter described herein is concerned with methods of fabricating semiconductor devices, more particularly to methods for performing a damascene process in fabricating a semiconductor.

Generally, semiconductor devices have electrical components, such as transistors, resistors, capacitors and interconnections connecting them, and insulating layers structurally supporting and electrically isolating the electrical components. In recent years, as the integration of semiconductor devices has increased, the electrical components required for fabricating such devices have become smaller in size and need to be positioned in very close proximity to each other. However, because the smaller size of electrical components requires reducing the cross-sectional areas of interconnections, the result is an increase in the electric resistance of such interconnections. In addition, undesirable RC delay and interference result from the increased densification and physical proximity of the electrical components. The increase in the electric resistance of interconnections, the RC delay and increased interference are among the major factors limiting the operation speed of modem semiconductor devices.

To overcome these troubles, it has been proposed that copper of low electrical resistance be used as a material for semiconductor electrical interconnections, and also that a low-k dielectric material be used as an intermetal dielectric (IMD). As is well-known, the electric conductivity of copper is higher than that of aluminum, which has been conventionally used for semiconductor interconnections. The higher electric conductivity of copper can prevent a reduction in data processing speed and an increase in power consumption, which are caused by the RC delay. In addition, because the phenomenon of electromigration (EM), which is known as a major problem of aluminum interconnections, can be effectively suppressed by using copper, semiconductor devices employing copper interconnections are free from the product defect and the process restriction caused by EM. Consequently, semiconductor devices employing copper interconnections have a higher yield than semiconductor devices employing aluminum interconnections.

Since, as is well known in this art, copper is unsuitable for carrying out vapor deposition and dry etching processes in semiconductor fabrication, a damascene process is needed in order to use copper as a material for semiconductor interconnections. More specifically, the copper interconnection can be formed by a damascene process that comprises the sequential steps of: forming an interlevel dielectric pattern with an opening on a semiconductor substrate, forming a copper film over the dielectric pattern and filling the opening, and etching the copper film by means of a chemical-mechanical polishing (CMP) technique. By this method, an interlevel dielectric pattern is formed comprising a low-k dielectric (k is a dielectric constant), as explained above. But, because the low-k dielectric thus formed is typically weak in terms of mechanical quality, scratches are easily formed on the top surface of the interlevel dielectric pattern during the CMP step. The scanning electron microscope (SEM) picture of FIG. 1 shows such scratches formed during the CMP step.

Such scratches make it difficult to remove conductive materials, which are deposited by subsequent processing steps, or metallic residues remaining from the CMP process. In this sense, the scratches are an important negative factor that causes a leakage current between interconnections and furthermore deteriorates the reliability of the semiconductor product. While the use of a passivation film on the interlevel insulation film pattern is sometimes helpful in reducing the problems caused by the scratches, the additional formation of the passivation film increases the number of processing steps and the cost for manufacturing the semiconductor product. Further, this approach also requires an additional operation for subsequently removing the passivation film used in minimizing the RC delay problem. Moreover, if the passivation film is removed by the CMP operation, the problems related to the formation of scratches is not satisfactorily overcome.

SUMMARY OF THE INVENTION

Accordingly, the present invention is directed to methods for carrying out a damascene process in semiconductor fabrication to overcome the problems associated with the scratches that are typically generated on a low-k interlevel insulation film using conventional fabrication methods.

The invention is also directed to methods for carrying out a damascene process to overcome the problems caused by scratches that are conventionally generated on a low-k interlevel insulation film without the need for the additional steps of forming and then removing a passivation film, which added steps lead to an increase in the manufacturing costs.

In order to achieve the desired objectives, this invention provides methods for carrying out a damascene process, which methods include a step of continuously forming layers or films of different chemical composition in a single reaction chamber. More particularly, the methods for carrying out a damascene process in accordance with this invention comprise the steps of: forming an intermetal dielectric film that varies continuously in chemical composition as sequential layers are deposited on a semiconductor substrate; patterning the intermetal dielectric film and forming an intermetal dielectric pattern that includes an opening penetrating the intermetal dielectric film; forming a conductive film to fill the opening on the intermetal dielectric pattern; and, etching the conductive film by means of a chemical/mechanical polishing operation until exposing an upward face of the intermetal dielectric pattern. Thereby, a conductive pattern is formed to fill the opening in the intermetal dielectric film. The etching step selectively removes an upper portion of the intermetal dielectric pattern. Because the intermetal dielectric film comprises sequentially deposited layers that vary in chemical composition according to the distance from the substrate, an upper portion of the intermetal dielectric pattern can be selectively removed by using etching selectivity that is established in accordance with the chemical composition of the uppermost layers of the intermetal dielectric film.

According to more particular embodiments of this invention, the intermetal dielectric film may be made of a material selected from the group consisting of SiOC, polyimide, polyamide-F, polyarylene ethers (PAE), polyarylene ethers-F, benzoctclobutene, benzoctclobutene-F, parylene F, parylene N, polynaphtalene F, polynaphtalene N, Teflon-AF, hydrocarbon-F, hydrogen silsesquioxane (HSQ), silica aerogel/xerogel, amorphous fluorovarbon (a-C:F), methyl silsesquioxane (MSQ), and fluorinated silicate glass (FSG).

According to a further invention embodiment, the step of forming the intermetal dielectric film may comprise the substeps of: after forming a main intermetal dielectric film that contains SiOC, forming an upper intermetal dielectric film containing a substantially higher molar proportion of oxygen than the main intermetal dielectric film. The formation steps for forming the main and upper intermetal dielectric films respectively are preferably performed in a continuous, uninterrupted process in a single reaction chamber. According to another invention embodiment, the method of forming the intermetal dielectric film may comprise the substeps of: forming a lower intermetal dielectric film containing a substantially higher molar proportion of oxygen than that present in the main intermetal dielectric film before forming the main intermetal dielectric film, and thereafter sequentially forming the main intermetal dielectric film and the upper intermetal dielectric film as described above, preferably all performed in a continuous, uninterrupted process in a single reaction chamber.

BRIEF DESCRIPTION OF THE FIGURES

The accompanying figures are included to provide a further understanding of the invention, and are incorporated in and constitute a part of this specification. The drawings illustrate exemplary embodiments of the invention and, together with the description, serve to explain principles of the present invention. In the figures.

DETAILED DESCRIPTION OF PREFERRED EMBODIMENTS

Figure 1:
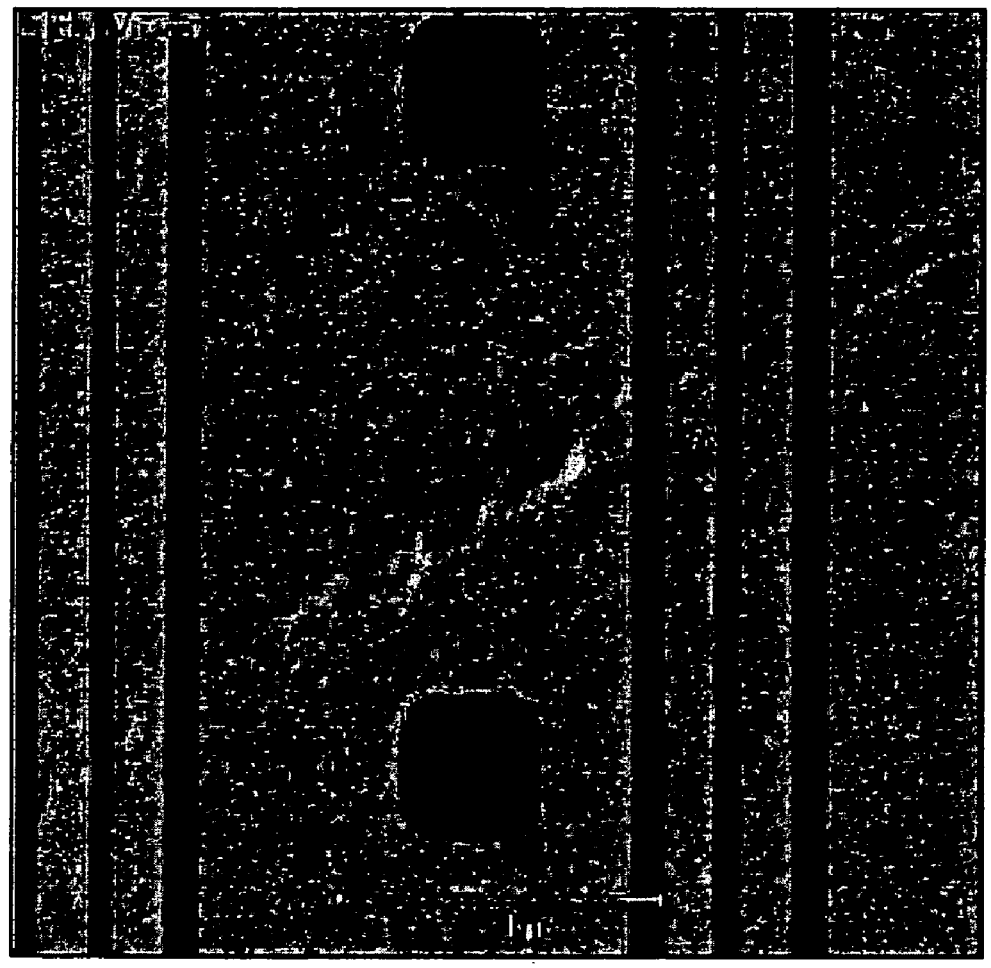
FIG. 1 is a view obtained by a scanning electron microscope, showing scratch formations formed on an interconnection insulation film during a CMP operation as part of a conventional semiconductor fabrication.

Preferred embodiments of the present invention will be described below in greater detail and with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the figures, the dimensions of certain layers and regions are exaggerated relative to other drawing elements for clarity of illustration. It will also be understood that when a layer (or film) is referred to as being 'on' another layer or substrate, it can be directly on (i.e., in physical contact with) the other layer or substrate, or alternatively intervening layers may also be present. Further, it will be understood that when a layer is referred to as being 'under' another layer, it can be directly under (i.e., in physical contact with) the other layer, or alternatively one or more intervening layers may also be present. In addition, it will also be understood that when a layer is referred to as being 'between' two layers, it can be the only layer between the two layers, or alternatively one or more intervening layers may also be present. Like reference numerals refer to like elements throughout the application.

Hereinafter, exemplary embodiments of the present invention will be described in conjunction with the accompanying illustrative drawings.

FIGS. 2 through 7 are schematic sectional views illustrating the steps in a damascene process in accordance with an embodiment of the present invention.

Figure 2:
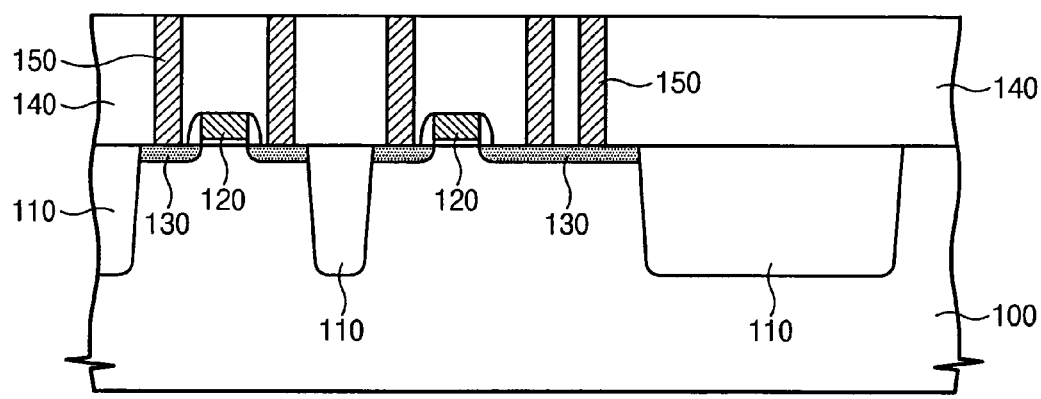
FIGS. 2 through 7 are schematic sectional views illustrating the steps in a damascene process in accordance with an embodiment of the present invention.

Referring to FIG. 2, field isolation films 110 are formed in predetermined regions along a surface of a semiconductor substrate 100 so as to define active fields. After forming gate electrodes 120 over the active fields, doped regions 130 are formed in the active fields by using the gate electrodes 120 to form a boundary of an ion implantation mask. The doped regions 130 constitute transistors along with the gate electrodes 120.

An interlayer dielectric (ILD) film 140 is then formed on the resultant structure including on the doped regions 130. The interlayer dielectric film 140 is patterned to form contact holes that expose the uppermost faces of the doped regions 130, and then contact plugs 150 are formed to fill up the contact holes. The ILD film 140 may be made of silicon oxide or of another low-k dielectric material. For example, the silicon oxide ILD film may be formed of a medium-temperature CVD oxide (MTO), a high-temperature CVD oxide (HTO), tetra-ethyl-ortho-silicate (TEOS), phosphorous silicate glass (PSG), boro-silicate glass (BSG), or borophospho-silicate glass (BPSG). The low-k dielectric material may be selected from the group consisting of SiOC, polyimide, polyimide-F, polyarylene ethers (PAE), polyarylene ethers-F, benzocyclobutene, benzocyclobutene-F, parylene F, parylene N, polynaphthalene F, polynaphthalene N, Teflon-AF, hydrocarbon-F, hydrogen silsesquioxane (HSQ), silica aerogel/xerogel, amorphous fluoro-carbon (a-C:F), methyl silsesquioxane (MSQ), and fluorinated silicate glass (FSG).

Figure 6:
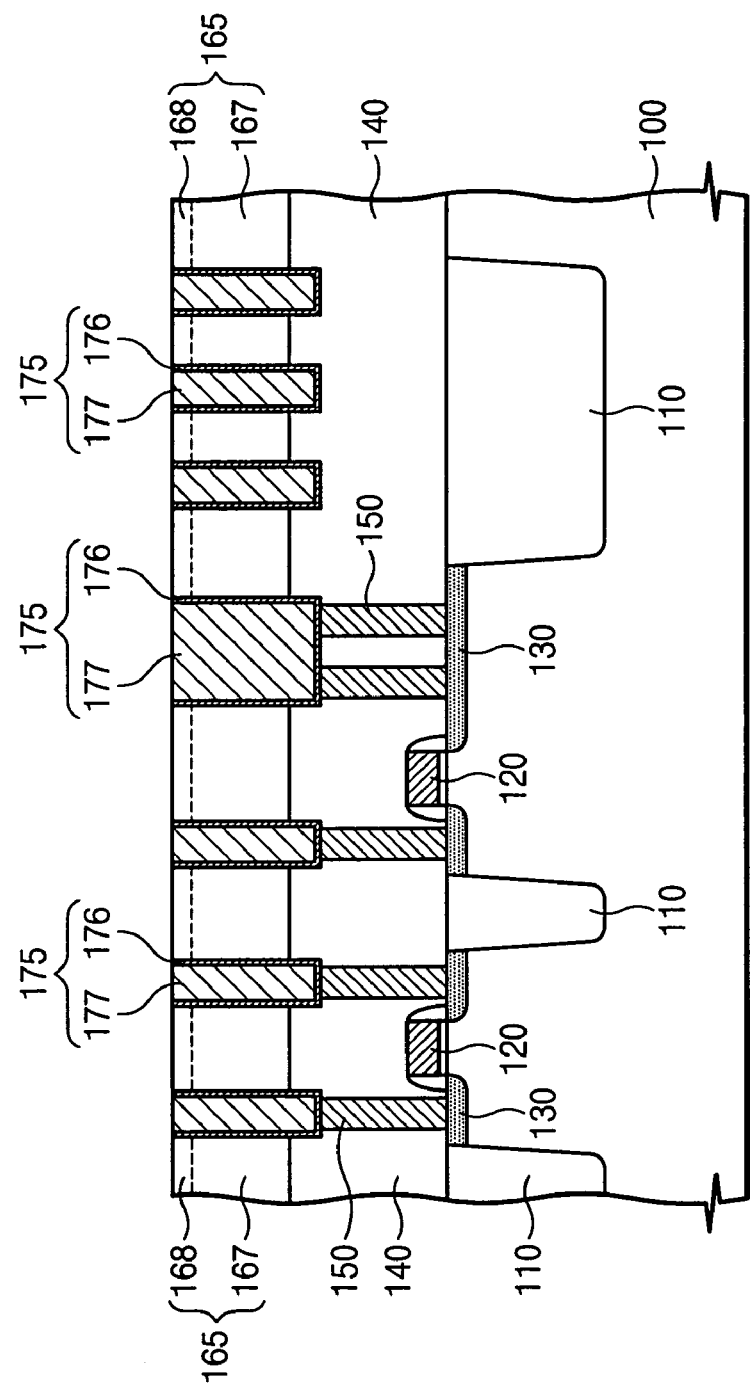

The contact plugs 150 for drilling the contact holes are formed by a step of contacting a conductive film on the ILD film 140 so as to fill up the contact holes, and thereafter etching away the contacting conductive film until exposing the upper surface of ILD film 140. The conductive film used for filling the contact holes may be made of tungsten, polysilicon, aluminum, or copper. When the contacting conductive film is formed of copper, it is preferred that the ILD film 140 be a low-k dielectric film. In this case, a dual damascene process may be used to simultaneously form the contact plugs 150 and various electrical interconnections (e.g., elements 175 as shown in FIG. 6) that otherwise would be formed in the subsequent processing step. Such a dual damascene process is disclosed in Korean Patent No. 2003-0087351, which is incorporated herein by reference.

Figure 3:
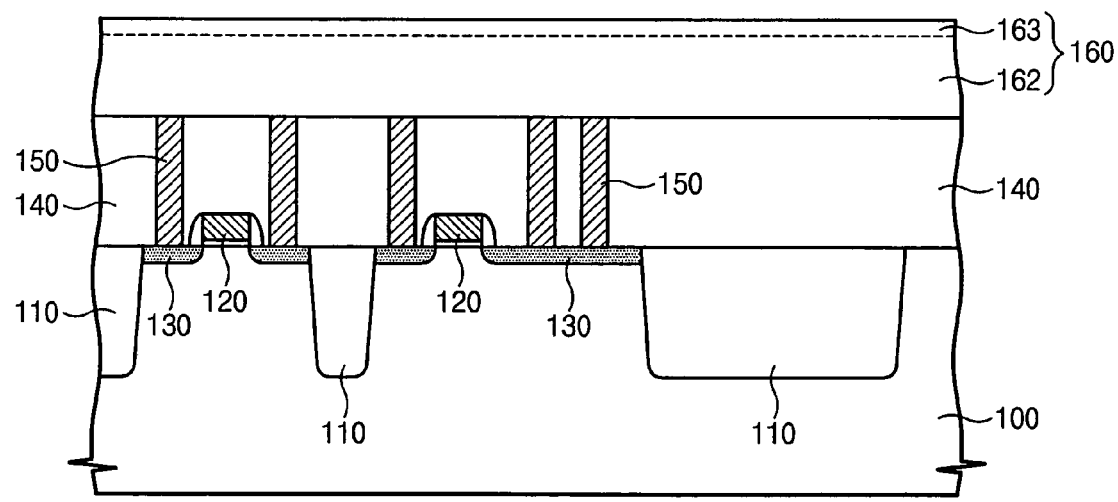

Referring to FIG. 3, an intermetal dielectric (IMD) film 160 is next formed on the resultant structure as shown in FIG. 2, including over the contact plugs 150. According to embodiments of the invention, the IMD film 160 may be formed of a low-k dielectric film. The low-k dielectric material for the IMD film 160 may be selected from the group consisting of SiOC, polyimide, polyimide-F, polyarylene ethers (PAE), polyarylene ethers-F, benzocyclobutene, benzocyclobutene-F, parylene F, parylene N, polynaphthalene F, polynaphthalene N, Teflon-AF, hydrocarbon-F, hydrogen silsesquioxane (HSQ), silica aerogel/xerogel, amorphous fluorocarbon (a-C:F), methyl silsesquioxane (MSQ), and fluorinated silicate glass (FSG).

According to an embodiment of the invention, the IMD film 160 may be a SiOC film formed by means of a CVD process. This SiOC film is a type of silicon oxide that includes an alkyl group, has low permittivity, and is superior to a typical organic material in its thermal and mechanical qualities. Because the steric hindrance of the alkyl group of this material generates nano-voids in a film, the SiOC film may have a low dielectric constant. More particularly, because the silicon oxide ($SiO_2$) film comprises a Si—O network in which Si—O bonding modes are completely combined with each other, an internal size of the Si—O bonding is very small, on the order of less than a nanometer. Relative to this small Si—O bonding distance, in the SiOC film, irregular reactions generated during the deposition process induce the formation of $S_1$—$CH_3$ bonds that subsequently interrupt and destroy the tight Si—O network. Such destruction of the Si—O network generates nano-voids, typically of several nanometers in size, in the SiOC film. These nano-voids reduce the density of the SiOC film, thereby also decreasing the polarizability of the SiOC film. Thus, the SiOC film has a dielectric constant (k) of less than 3, which is smaller than that of $SiO_2$. As a result, the dielectric constant of the SiOC is dependent on the density of the alkyl-group elements in the material. An abundance of alkyl-group elements in the material has a tendency to make the SiOC film be weaker in thermal and mechanical stabilities than an SiOC film having a lower concentration of alkyl groups.

The SiOC film may be formed by means of a plasma-enhanced CVD (PECVD) process. The PECVD process typically uses a silicon-containing precursor, oxygen as a reaction gas, and argon or helium as a carrier gas. According to an embodiment of the invention, the silicon-containing precursor may be selected from the group consisting of phenyltrimethoxy-silane (PTMSM; $C_6H_5Si(OCH_3)_2$), trimethylsilane (TMS; $Si(CH_3)_4$), and bis-trimethylsilyl-methane (BTMSM; $H_9C_3$—Si—$CH_2$—$S_1$—$C_3H_9$). The SiOC film may also be formed by means of a process using high-density plasma CVD, such as the inductively coupled plasma CVD (ICPCVD) technique.

According to the invention, the IMD film 160 varies in chemical composition as sequential layers are deposited. Thus, as illustrated in FIG. 3, the IMD film 160 may be comprised of a main IME film 162 and an upper IMD film 163, each of different chemical composition. The difference in the chemical compositions of main IMD film 162 and upper IMD film 163 must be sufficient to provide etching selectivity so that an etching composition can be constituted so as to effectively etch upper IMD film 163 while having minimal if any effect on main IMD film 162. Such a layered IMD film 160 comprised of at least two layers of different chemical compositions can be formed by adjusting a composition of a reaction gas and/or adjusting a processing condition while depositing the IMD film 160. For example, when the IMD film 160 is an SiOC type of film, it is possible to change the chemical composition of a subsequently-deposited layer of the IMD film 160 relative to that of a previously-deposited layer of the IMD film 160 by adjusting a molar ratio of a silicon-containing precursor relative to oxygen gas in a feed mixture used to form the SiOC film. Thus, according to an embodiment of the invention, the upper IMD film 163 is formed under the processing condition of a higher molar ratio of the oxygen gas (represented for example by a higher flow rate of oxygen) relative to the silicon-containing precursor than that used in forming the main IMD film 162. Thus, the upper IMD film 163 is formed having a chemical composition that is similar to, yet different from, the main IMD film 162. In this case, the main IMD film 162 and the upper IMD film 163, although of different chemical compositions, are continuously formed in the same reaction chamber. As a result, according to the invention, there is no need for a separate step of independently forming the upper IMD film 163.

Figure 4:
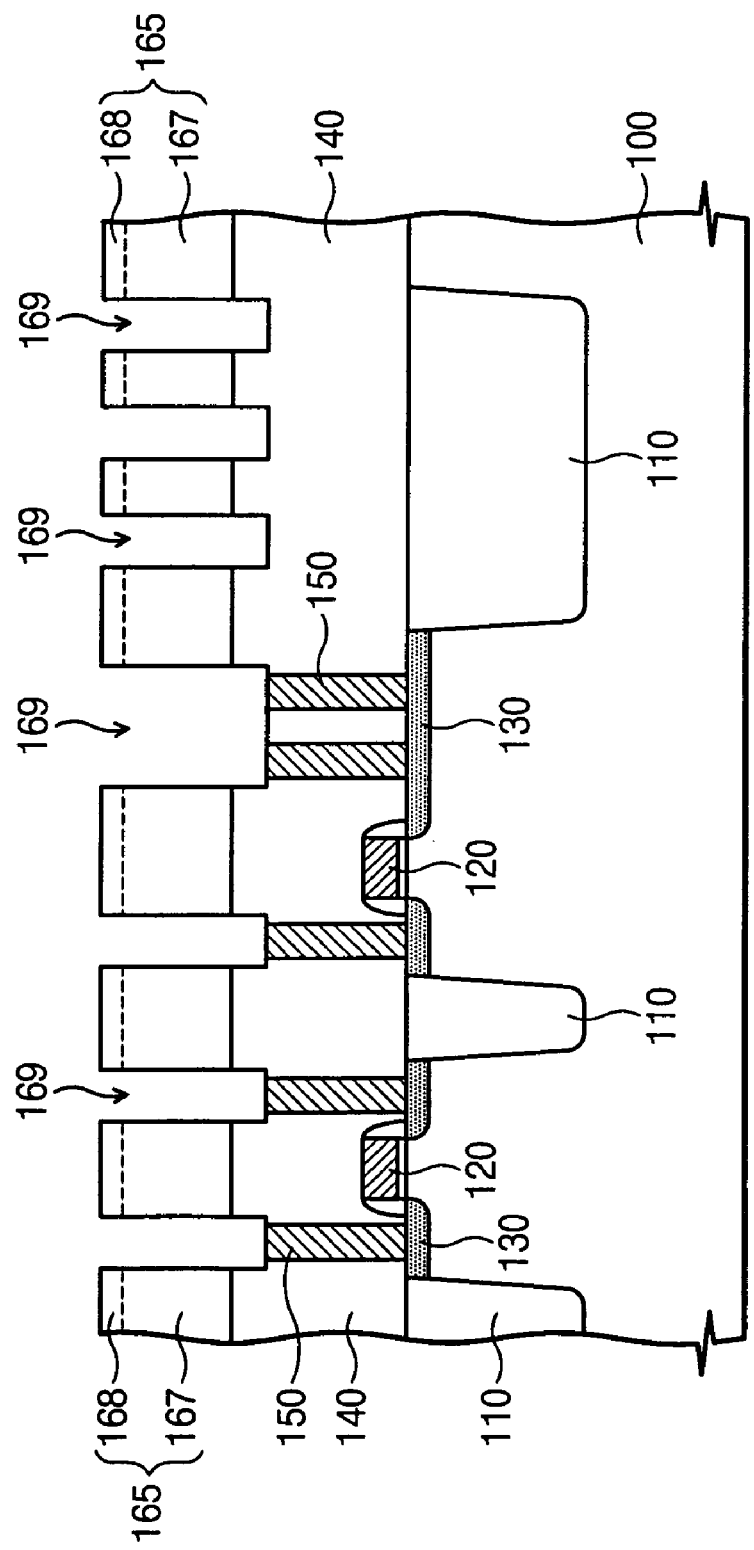

Referring now to FIG. 4, the IMD film 160 (as shown in FIG. 3), comprising at least a main IMD film 162 and an upper IMD film 163, is patterned to form an IMD pattern 165 that includes openings 169 to expose upper faces of the contact plugs 150. Patterning the IMD film 160 may include a step of using an etching mask with a photoresist pattern (not shown) that is prepared by a photolithography process. Further, patterning the IMD film 160 may include a step of anisotropically etching the IMD film 160 with a chemical composition that has etching selectivity relative to the ILD film 140 and the contact plugs 150. In carrying out this etching step, the openings 169 also function as molds or patterns to define the configurations of the interconnections (reference numerals 175 of FIG. 6) which are formed in the subsequent process. According to the aforementioned embodiment, the IMD pattern 165 is comprised of a main IMD pattern 167 and an upper IMD pattern 168 stacked in sequence on the ILD 140. The main and upper IMD patterns 167 and 168 respectively correspond in chemical composition with the main and upper IMD films 162 and 163 respectively formed in an earlier step (FIG. 3).

Figure 8:
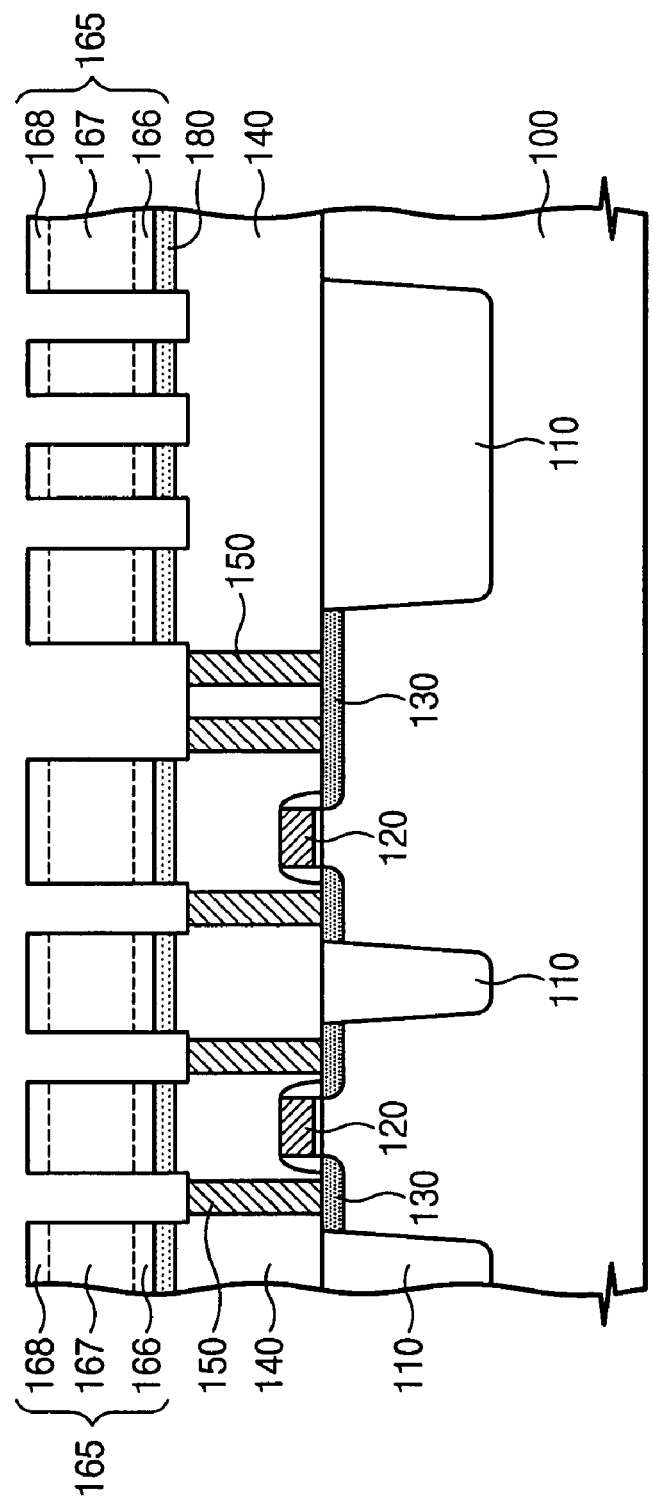
FIG. 8 is a schematic sectional view illustrating a further feature of the damascene process in accordance with another embodiment of the invention.

According to another embodiment of the invention, an etch-stopping layer 180 may be formed on the ILD 140, as shown in FIG. 8, in order to prevent the ILD 140 from being excessively recessed during the etching step for forming the openings 169. The etch-stopping layer 180 is formed before deposing the IMD film 160. The etch-stopping layer 180 is preferably made of a material having etching selectivity relative to the IMD film 160.

To minimize mechanical stresses from being applied to the IMD film 160 and resultant damages to the IMD film 160 due to such mechanical stresses during the subsequent CMP operation, there is a need to enhance the adhesive strength between the IMD film 160 and the film thereunder (which may be the ILD 140 as in FIG. 3 or an etch-stopping layer 180 as in FIG. 8). In order to enhance the adhesive strength between the IMD film 160 and the adjacent underlying layer, it is preferred for the IMD film 160 to be made of a material having a relatively high adhesive strength with respect to the etch-stopping layer 180. To satisfy this requirement, as illustrated in FIG. 8, forming the IMD film 160 may further include a step of depositing a lower IMD film 166 on the adjacent underlying layer (e.g., on the etch-stopping layer 180) before forming the main IMD film 162 (as seen in FIG. 3). The lower IMD film 166 is selectively etched away (along with the main IM) film 162 and the upper IMD film 163) by the patterning process used for forming the openings 169 (as seen in FIG. 4), resulting in a lower IMD pattern 166. In other words, the complete IMD pattern 165 in this invention embodiment is comprised of the lower IMD pattern 166, the main IMD pattern 167, and the upper IMD pattern 168 stacked in sequence on the etch-stopping layer 180.

As in the process for forming the upper IMD film 163, the lower IMD film 166 can be formed by adjusting a composition of the reaction gas and/or a processing condition while depositing the IMD film 160. More particularly, the lower IMD film 166 is preferably formed under a process condition in which a higher molar ratio of the oxygen gas relative to the silicon-containing precursor is used (e.g., by increasing the flow rate of oxygen gas) as compared with that used for forming the main IMD film 162. Thus, the lower IMD film 166 is formed having a chemical composition that is similar to, yet different from, the main IMD film 162. Because the thus formed silicon oxide film has strong adhesion to the etch-stopping layer (i.e., a silicon nitride film) 180, the overall IMD film 160 according to this embodiment of the invention can be expected to have improved adhesion to its adjacent lower film (i.e., the etch-stopping layer 180). In addition, in the preferred method for carrying out this embodiment of the invention, the lower IMD film is continuously formed in the same reaction chamber together with the main IMD film 162 and the upper IMD film 163. As a result, as discussed above with respect to forming the upper IMD film 163, there is no need for an independent process step for forming the lower IMD film 166.

Figure 5:
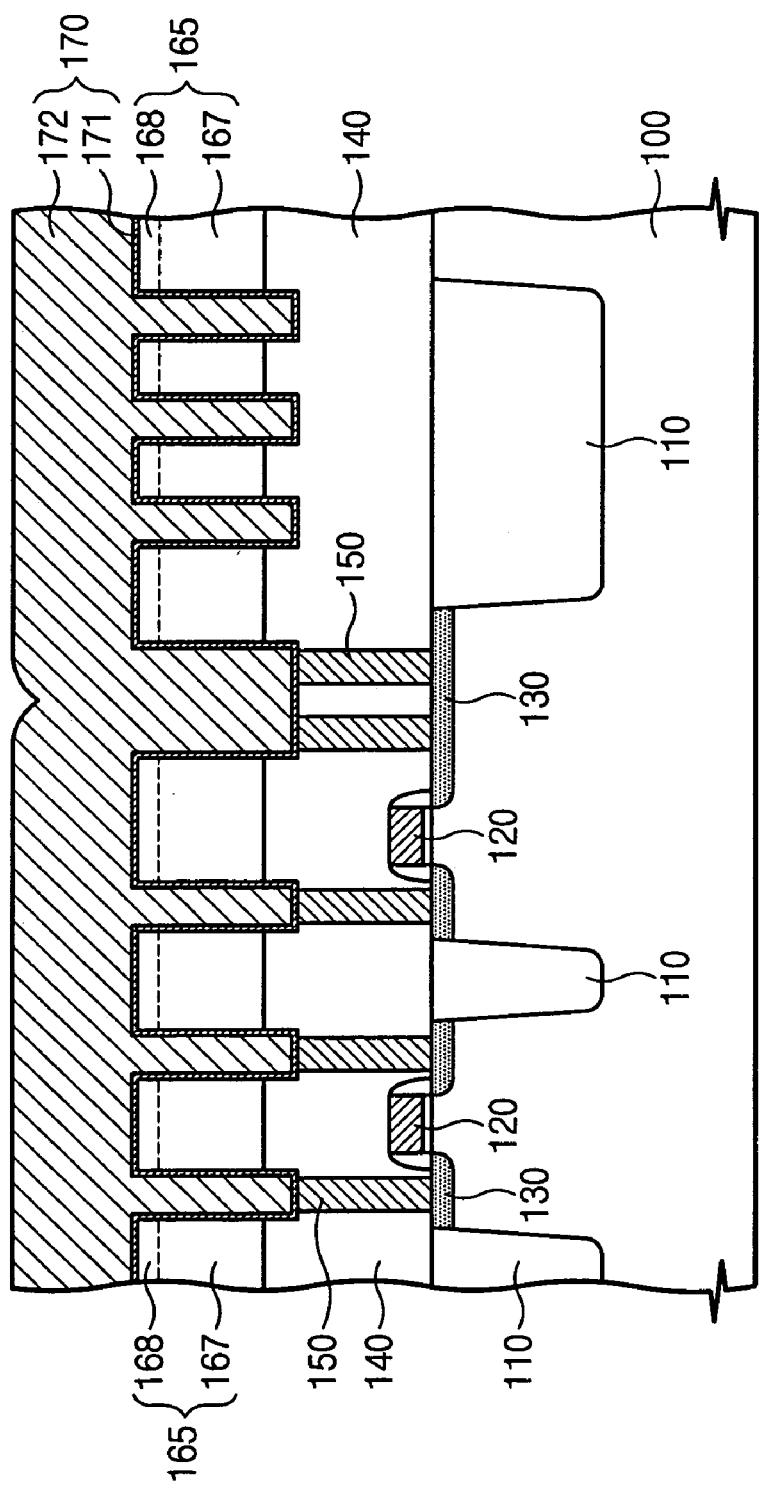

Referring now to FIG. 5, on the resultant structure including the IMD pattern 165 (as shown either in FIG. 4 or as in FIG. 8), a conductive film 170 is formed so as to fill the openings 169 (as seen in FIG. 4). The conductive film 170 may be made, for example, of copper, tungsten, aluminum, polysilicon, titanium, tantalum, titanium nitride, or tantalum nitride. According to a preferred embodiment of the invention, the conductive film 170 may be a copper film that is formed by an electrical plating technique.

If the conductive film 170 is formed using copper in the manner shown in FIG. 5, it may be formed of a seed layer 171 followed by a full copper film 172. The seed layer 171 may be formed by a technique of sputtering, thereby conformably covering the inner walls of the openings 169. After this initial coating process, the full copper film 172 is formed to fill the openings 169, for example by way of an electrical plating technique using the seed layer 171 as an electrode.

Referring now to FIG. 6, the conductive film 170 (as seen in FIG. 5) is etched until exposing the upper face of the IMD pattern 165, thereby forming the interconnections 175 that fill up the openings 169. According to the aforementioned embodiment, the interconnections 175 may preferably be comprised of seed patterns 176 and copper patterns 177 which result from etching the seed layer 171 and the copper film 172 of FIG. 5. In an invention embodiment, it is preferred that the method for forming the interconnections 175 include a step of "flattening" the conductive film 170 by means of a CMP operation to insure better electrical contacting surfaces. Such a CMP operation may be carried out using a slurry that has etching selectivity relative to the upper IMD pattern 167.

As previously described for conventional fabrication techniques, this CMP operation would ordinarily lead to surface damage, such as scratches on the upper face of the IMD pattern 165. But, the IMD pattern 165 according to this invention includes the upper IMD pattern 168 that has a chemical composition similar to the silicon oxide film. Accordingly, the method of this invention is more effective than the conventional techniques in tolerance against mechanical stress, because the silicon oxide film formed in accordance with this invention has an excellent mechanical quality that is significantly better than that of the low-dielectric material constituting the upper portion of conventional IMD films. The improvement in scratch-resistance that the upper surfaces of IMD films according to this invention demonstrate relative to conventional IMD films may, by itself, however, not be sufficient for some semiconductor applications. Because any scratches on the surface of IMD pattern 165 cause product defects, such as leakage currents, it is preferred to substantially completely eliminate such scratches. A further embodiment of this invention, as discussed below, involves additional method steps to substantially remove surface scratches.

Figure 7:
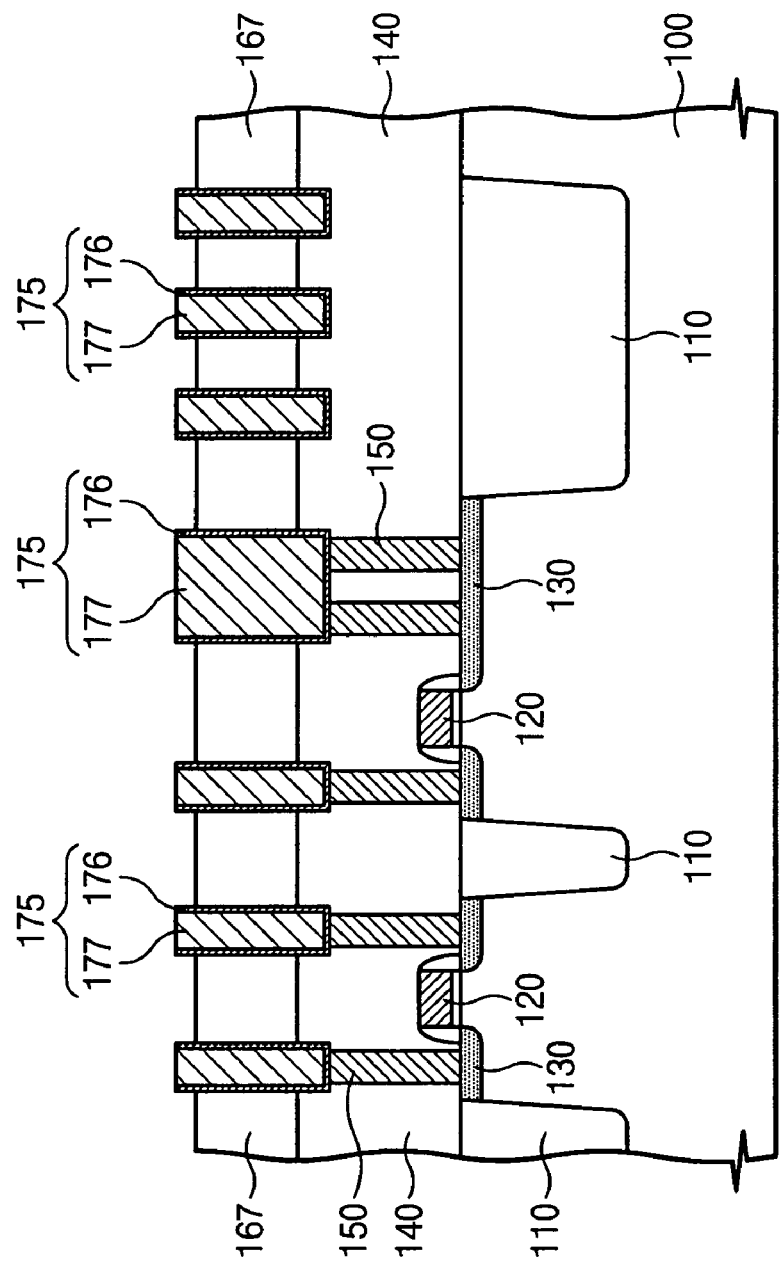

Referring now to FIG. 7, the upper portion of the IMD pattern 165 (as seen in FIG. 6) is etched away in order to completely remove any scratches. According to the aforementioned embodiment, this operation includes a step of removing the upper IMD pattern 168 using a chemical composition having etching selectivity relative to the main IMD pattern 167. The necessary etching selectivity needed to carry out this step is based on the difference in chemical compositions between the main IMD pattern 167 and the upper IMD pattern 168. For instance, an etchant containing fluoric acid, which is well known as a solution for etching silicon oxide, may be utilized to selectively remove the upper IMD pattern 168 while minimizing any erosion or damage to the main IMD pattern 167 when films 162 and 163 (FIG. 3) are formed according to this invention. In addition, the etchant for carrying out this step may further advantageously include at least one chemical component, such as hydrogen peroxide or hydrochloric acid, in order to remove residual metallic contaminants that might have been left from the earlier CMP process. Because such metallic pollutions may act as another factor to cause leakage current, this modification in the composition of the etchant is helpful in overcoming problems with leakage current.

As described above, the methods of this invention make it possible substantially to eliminate damages or defects arising from a CMP operation in semiconductor fabrication by selectively removing the upper portion of the IMD film. Thus, it is possible to overcome the problem of leakage current caused by surface scratches, thereby enhancing product yields and operating performance of semiconductor devices. Further, the IMD films of this invention include layers that are different in chemical composition but which can still be continuously formed in a single reaction chamber. The differences in chemical compositions of the layers of the IMD films of this invention provide the opportunity for realizing etching selectivity for selectively removing a scratched or damaged upper portion of the IMD film. Moreover, because the layers of the IMD film are continuously formed in the same reaction chamber, there is no need for the additional process step of forming and later removing a passivation film having the etching selectivity. As a result, the present invention is advantageous in solving the problems caused by CMP scratches without increasing the costs of processing.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for carrying out a damascene process in semiconductor fabrication, comprising the sequential steps of:

forming an intermetal dielectric film comprising at least a main layer and an upper layer each of a different chemical composition, on a semiconductor substrate;

patterning the intermetal dielectric film to form an intermetal dielectric pattern having at least an opening that penetrates the intermetal dielectric pattern;

forming a conductive film of a conductive material on the intermetal dielectric pattern so as to fill the opening with the conductive material;

etching the conductive film using a chemical/mechanical polishing operation to form a conductive pattern that exposes the top face of the intermetal dielectric pattern and fills the opening; and selectively removing said upper layer of the intermetal dielectric pattern using etching selectivity resulting from the difference in chemical composition of the main layer and the upper layer to remove scratches caused by the chemical/mechanical polishing operation.

2. The method as set forth in claim 1, wherein the intermetal dielectric film is made of a material selected from the group consisting of SiOC, polyimide, polyimide-F, polyarylene ethers (PAE), polyarylene ethers-F, benzocyclobutene, benzocyclobutene-F, parylene F, parylene N, polynaphthalene F, polynaphthalene N, Teflon-AF, hydrocarbon-F, hydrogen silsesquioxane (HSQ), silica aerogel/xerogel, amorphous fluorocarbon (a-C:F), methyl silsesquioxane (MSQ), and fluorinated silicate glass (FSG).

3. The method as set forth in claim 1, wherein the step of forming of the intermetal dielectric film comprises the substeps of:

forming a main intermetal dielectric film that is made of SiOC; and forming an upper intermetal dielectric film on the main dielectric film, wherein the upper intermetal film has a higher molar ratio of oxygen to silicon than the main intermetal dielectric film, further wherein the main and upper intermetal dielectric films are continuously formed in a single reaction chamber.

4. The method as set forth in claim 3, further wherein, before the step of forming the main intermetal dielectric film, a lower intermetal dielectric film is formed, wherein the lower intermetal film has a higher molar ratio of oxygen to silicon than the subsequently formed main intermetal dielectric film, further wherein the lower, main, and upper intermetal dielectric films are continuously formed in a single reaction chamber.

5. The method as set forth in claim 3, wherein the step of forming the conductive pattern comprises chemically and mechanically polishing the conductive film using a slurry having etching selectivity relative to the upper intermetal dielectric film so as to expose a top surface of the upper intermetal dielectric film.

6. The method as set forth in claim 3, wherein the step of selectively removing the upper portion of the intermetal dielectric pattern comprises the step of removing the upper intermetal dielectric film using an etch composition having etching selectivity relative to the main intermetal dielectric film.

7. The method as set forth in claim 6, wherein the step of selectively removing the upper portion of the intermetal dielectric pattern comprises the step of removing the upper intermetal dielectric film using an etchant containing fluoric acid.

8. The method as set forth in claim 1, wherein the step of forming the conductive film comprises the step of forming a copper film by means of an electrical plating technique.

9. The method as set forth in claim 1, further comprising a step of forming an etch-stopping layer on the semiconductor substrate before the step of forming the intermetal dielectric film.

10. The method as set forth in claim 6 wherein said etch composition further comprises a component effective in removing residual metal contaminants.

11. The method as set forth in claim 7 wherein said etchant also contains an amount of hydrogen peroxide or hydrochloric acid effective to remove residual metal contaminants.

12. A method for carrying out a damascene process in semiconductor fabrication, comprising the sequential steps of:

forming an intermetal dielectric film comprising at least a lower layer, a main layer and an upper layer each of a different chemical composition, on a semiconductor substrate;

patterning the intermetal dielectric film to form an intermetal dielectric pattern having at least an opening that penetrates the intermetal dielectric pattern;

forming a conductive film of a conductive material on the intermetal dielectric pattern so as to fill the opening with the conductive material;

etching the conductive film using a chemical/mechanical polishing operation to form a conductive pattern that exposes the top face of the intermetal dielectric pattern and fills the opening; and selectively removing said upper layer of the intermetal dielectric pattern using etching selectivity resulting from the difference in chemical composition of the main layer and the upper layer to remove scratches caused by the chemical/mechanical polishing operation.

13. A method for carrying out a damascene process in semiconductor fabrication, comprising the sequential steps of:

forming an etch-stopping layer on a semiconductor substrate;

forming an intermetal dielectric film comprising at least a lower layer, a main layer and an upper layer each of a different chemical composition, on the etch-stopping layer;

patterning the intermetal dielectric film to form an intermetal dielectric pattern having at least an opening that penetrates the intermetal dielectric pattern;

forming a conductive film of a conductive material on the intermetal dielectric pattern so as to fill the opening with the conductive material;

etching the conductive film using a chemical/mechanical polishing operation to form a conductive pattern that exposes the top face of the intermetal dielectric pattern and fills the opening; and selectively removing said upper layer of the intermetal dielectric pattern using etching selectivity resulting from the difference in chemical composition of the main layer and the upper layer to remove scratches caused by the chemical/mechanical polishing operation.

14. A semiconductor device fabricated according to the method of claim 1.

15. A semiconductor device fabricated according to the method of claim 12.

16. A semiconductor device fabricated according to the method of claim 13.

* * * * *